US012754272B2

(12) United States Patent
Zhang et al.

(10) Patent No.: US 12,754,272 B2
(45) Date of Patent: Oct. 6, 2026

(54) ECHO PLANAR IMAGING METHOD CAPABLE OF REDUCING IMAGE DISTORTION

(71) Applicant: Shanghai Jiao Tong University, Shanghai (CN)

(72) Inventors: Zhiyong Zhang, Shanghai (CN); Hao Chen, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 186 days.

(21) Appl. No.: 18/691,822

(22) PCT Filed: Aug. 23, 2022

(86) PCT No.: PCT/CN2022/114111
§ 371 (c)(1),
(2) Date: Mar. 13, 2024

(87) PCT Pub. No.: WO2023/035930
PCT Pub. Date: Mar. 16, 2023

(65) Prior Publication Data

US 2025/0130300 A1 Apr. 24, 2025

(30) Foreign Application Priority Data

Sep. 13, 2021 (CN) ......................... 202111068774.4

(51) Int. Cl.
*G01R 33/56* (2006.01)
*G01R 33/565* (2006.01)

(52) U.S. Cl.
CPC .............................. *G01R 33/56554* (2013.01)

(58) Field of Classification Search
CPC .............. G01R 33/00; G01R 33/56554; G01R 33/0035; G01R 33/0023; G01R 33/0017;
(Continued)

(56) References Cited

U.S. PATENT DOCUMENTS 7,906,964 B2 * 3/2011 Fleysher ................ G01R 33/54
324/309
2014/0152308 A1 * 6/2014 Lee .................... G01R 33/5659
324/309
2017/0205486 A1 * 7/2017 Zeller ................ G01R 33/5608

FOREIGN PATENT DOCUMENTS

CN 108196210 A 6/2018
CN 109100669 A 12/2018
(Continued)

OTHER PUBLICATIONS

Shanghai Jiao Tong University, English Machine Translation of CN 113805133 A (listed above).
(Continued)

*Primary Examiner* — Lee E Rodak
*Assistant Examiner* — Taqi R Nasir
(74) *Attorney, Agent, or Firm* — McLane Middleton, Professional Association

(57) ABSTRACT

An echo planar imaging method capable of reducing image distortion is provided. Two radio frequency (RF) pulses α and β are used to respectively flip over a longitudinal magnetization into a transverse plane at different moments, so as to obtain observable transverse magnetization; the transverse magnetization obtained by flipping over the longitudinal magnetization by means of α and β are respectively rephased in two different echo trains by means of gradient pulses. Navigator echo signals are respectively collected before the two gradient echo trains, and the amplitude difference between two gradient echo train signals is corrected on the basis of the amplitude difference between the two navigator echo signals. Correcting the signals collected by the two gradient echo trains, so as to obtain two pieces of image data, and the two pieces of image data are averaged to obtain a final image.

10 Claims, 4 Drawing Sheets

(58) Field of Classification Search
CPC ............ G01R 31/3191; G01R 33/0358; G01R 33/0356; G01B 7/004; G01C 17/38; G06F 3/017; G06F 3/0346; G06F 3/012; H01L 39/223
USPC .......................................... 324/307, 309, 306
See application file for complete search history.

(56) References Cited

FOREIGN PATENT DOCUMENTS

| | | | |
|---|---|---|---|
| CN | 109549645 | A | 4/2019 |
| CN | 111090069 | A | 5/2020 |
| CN | 113805133 | A | 12/2021 |

OTHER PUBLICATIONS

Xiamen University, English Machine Translation of CN 109100669 A (listed above).
Shenzhen Institute of Advanced Technology, English Machine Translation of CN 111090069 A (listed above).
Samsung Electronics Co., Ltd., English Machine Translation of CN 109549645 A (listed above).
Beijing Hanshi Medical Tech Co., Ltd., English Machine Translation of CN 108196210 A (listed above).

* cited by examiner

ECHO PLANAR IMAGING METHOD CAPABLE OF REDUCING IMAGE DISTORTION

CROSS REFERENCE TO RELATED APPLICATION

This patent application is a national stage application of International Patent Application No. PCT/CN2022/114111, filed on Aug. 23, 2022, which claims the benefit and priority of Chinese Patent Application No. 202111068774.4, filed with the China National Intellectual Property Administration on Sep. 13, 2021, the disclosure of which is incorporated by reference herein in its entirety as part of the present application.

TECHNICAL FIELD

The present disclosure relates to the field of magnetic resonance imaging (MRI), and in particular, to an echo planar imaging method capable of reducing image distortion.

BACKGROUND

Magnetic Resonance Imaging (MRI) can non-invasively detect clear anatomical structures of living tissues and generate images reflecting organic lesions. It provides physiological information to meet various diagnostic needs and is one of the most commonly used medical detection methods today. Echo Planar Imaging (EPI) completes data scan of the entire two-dimensional k-space with just one radio frequency (RF) excitation, obtaining a complete two-dimensional image within a few tens of milliseconds. It is currently one of the fastest MRI technologies. EPI has overcome the limitations of scan speed in the application of MRI technology, further expanding the application scope of the MRI technology. EPI has been widely used in MRI scans, including diffusion imaging, perfusion imaging, and functional imaging, making it an important tool for clinical disease diagnosis and scientific research.

However, EPI is highly sensitive to magnetic field inhomogeneity and chemical shift artifacts. Image distortion and signal loss are likely to occur in non-uniform magnetic fields, especially at interfaces between air and tissues, such as the frontal and orbital regions in brain scans. Although non-Cartesian sampling trajectories like spiral sampling can effectively shorten the sampling time of MRI data, these non-Cartesian sampling methods are also sensitive to the imperfect performance of magnetic resonance gradients, and the stability needs to be further investigated. On the other hand, some methods, such as pre-scanning to obtain correction information or multiple shots, can correct or reduce image distortion caused by magnetic field inhomogeneity but may decrease scanning efficiency and may incur inconsistencies between multiple shots.

In the prior art, single-shot EPI or multi-shot EPI methods are commonly employed.

The existing single-shot EPI achieves continuous rapid encoding of k-space through continuous gradient echo sampling and phase encoding blip gradients, completing data filling of the entire k-space in a shot to obtain a two-dimensional image. However, unlike spin echo, the gradient echo sampling cannot rephase the evolving phase due to magnetic field inhomogeneity, and as spatial encoding progresses, and phase differences gradually accumulate, leading to distortion in the final image. The single-shot EPI sequence in the prior art is shown in FIG. 1.

Multi-shot EPI divides k-space into multiple segments for phase encoding, reducing the time interval for phase encoding, decreasing accumulated phase differences caused by magnetic field inhomogeneity, and effectively reducing EPI image distortion and improving resolution. However, since k-space is divided into multiple segments, and cannot be filled in a single shot, making it susceptible to motion artifacts caused by motion in the scanned area. Although techniques like periodically rotated overlapping parallel lines with enhanced reconstruction ("PROPELLER") can alleviate motion artifacts in multi-shot EPI, the multi-shot method increases the scan time, reduces scanning efficiency, and is not suitable for scenarios with high temporal resolution requirements, limiting the improvement of EPI image quality and further applications. The k-space filling trajectory in the prior art is shown in FIG. 2.

Therefore, professionals in this field are dedicated to developing an echo planar imaging method capable of reducing image distortion, to shorten the time for spatial encoding, reduce phase accumulation caused by magnetic field inhomogeneity, and minimize image distortion without increasing the number of shots or scan time, thereby ensuring scan efficiency.

SUMMARY

To achieve the above objectives, the present disclosure provides an echo planar imaging method capable of reducing image distortion. The method is based on a first RF pulse with a flip angle of $\alpha$, a second RF pulse with a flip angle of $\beta$, a spin echo module, as well as a first gradient echo train and a second gradient echo train for collecting echo-planar signals, and specifically includes the following steps:

- step 1: exciting a first-part magnetization into a transverse plane by using an excitation level of the first RF pulse and keeping a second-part magnetization in a longitudinal plane;
- step 2: after a delay, exciting the second-part magnetization into the transverse plane by using an excitation level of the second RF pulse;
- step 3: applying the spin echo module;
- step 4: rephasing the first-part magnetization by using gradient pulses, and detecting a signal of the transverse first-part magnetization in the first gradient echo train to obtain a first signal;
- step 5: rephasing the second-part magnetization by using gradient pulses, and detecting a signal of the transverse second-part magnetization in the second gradient echo train to obtain a second signal;
- step 6: alternately storing the first signal and the second signal along a phase encoding direction to reconstruct k-space, thereby obtaining a final image.

Optionally, the flip angle of the first RF pulse is 47°, and the flip angle of the second RF pulse is 122°.

Optionally, in step 2, the delay is equal to a time interval between centers of the first gradient echo train and the second gradient echo train.

Optionally, in step 3, the spin echo module containing a 180° RF pulse is applied to obtain $T_2$-weighted images with reduced distortion.

Optionally, in step 3, diffusion-weighted gradients are applied at both sides of the 180° RF pulse to obtain diffusion-weighted images with reduced distortion.

Optionally, in step 3, the spin echo module is not applied, to obtain $T_2$*-weighted images with reduced distortion.

Optionally, in step 4 and step 5, a momentum of $2/(\gamma_H{*}FoV_{PE})$ is selected for phase encoding gradients, where $\gamma_H$ is a gyromagnetic ratio of hydrogen nuclei, and $FoV_{PE}$ is a size of an imaging field of view in the phase encoding direction.

Optionally, in step 4 and step 5, a momentum of $4/(\gamma_H{*}FoV_{PE})$ is selected for phase encoding gradients, where $\gamma_H$ is a gyromagnetic ratio of hydrogen nuclei, and $FoV_{PE}$ is a size of an imaging field of view in the phase encoding direction.

Optionally, in step 6, navigator echo signals are respectively collected before the first gradient echo train and the second gradient echo train, and an amplitude difference between signals of the first gradient echo train and the second gradient echo train is corrected by using an amplitude difference between the two navigator echo signals, where a navigator echo is a gradient echo without phase encoding.

Optionally, in step 6, signals of the first gradient echo train and the second gradient echo train are reconstructed using a MUSSELS (as defined below) method, to obtain two sets of image data, and the two sets of image data are averaged to obtain the final image. As used herein, it is understood that "MUSSELS" means multi-shot sensitivity encoded diffusion data recovery using structured low rank matrix completion.

Optionally, in step 4 and step 5, phase encoding gradients with different polarities are used for the first gradient echo train and the second gradient echo train; two images are reconstructed from the signals of the first gradient echo train and the second gradient echo train, and magnetic field distribution is estimated based on the two images, thereby correcting image distortion.

Optionally, a third RF pulse and a third gradient echo train are further applied. Signals are collected by using the first gradient echo train, the second gradient echo train, and the third gradient echo train. In step 4 and step 5, a momentum of $3/(\gamma_H{*}FoV_{PE})$ is selected for phase encoding gradients, where $\gamma_H$ is a gyromagnetic ratio of hydrogen nuclei, and $FoV_{PE}$ is a size of an imaging field of view in the phase encoding direction.

Compared to the single-shot methods in the prior art, the technology provided in the present disclosure significantly improves imaging accuracy through an echo planar imaging method based on multi-RF excitation, thus effectively reducing image distortion. Moreover, the technical solution of the present disclosure remains a single-shot scan. Therefore, the technical solution of the present disclosure achieves a significant improvement in imaging efficiency compared to the multi-shot methods in the prior art.

The concept, specific structures, and technical effects of this application will be further described below in conjunction with accompanying drawings, such that the purpose, features, and effects of this application can be fully understood.

DETAILED DESCRIPTION OF THE EMBODIMENTS

Figure 1:
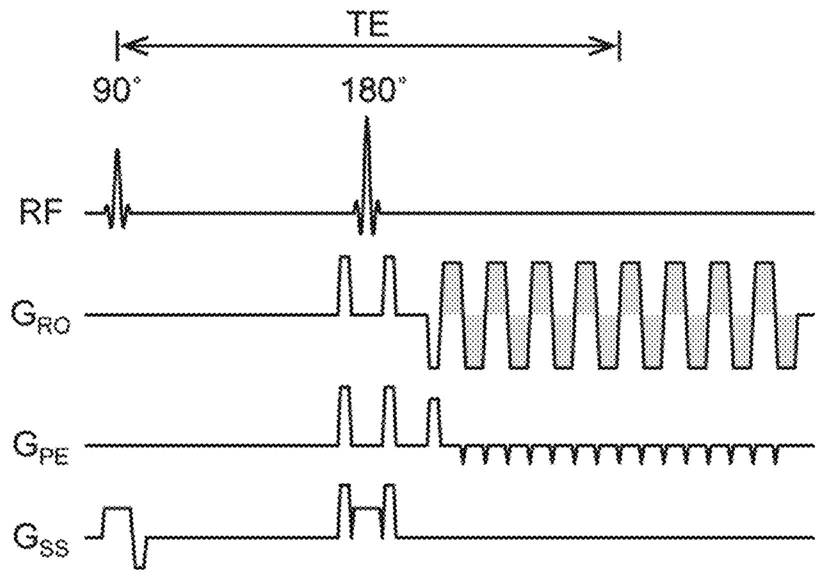
FIG. 1 is a schematic diagram of a single-shot EPI sequence in the prior art.
Figure 2:
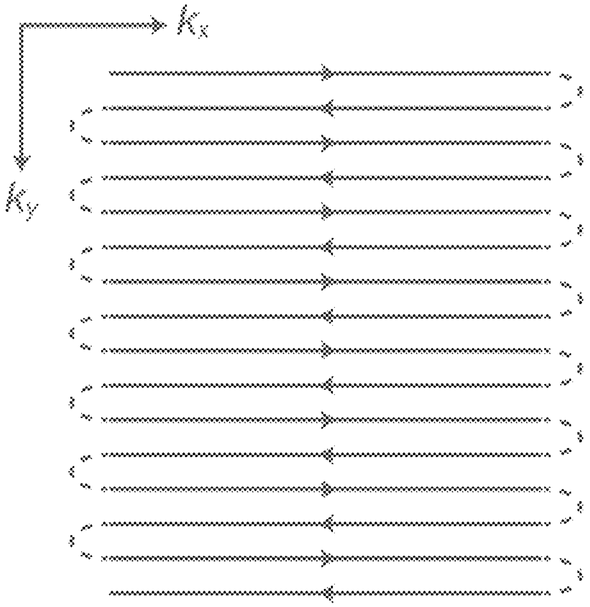
FIG. 2 is a schematic diagram of a k-space filling trajectory in the prior art.

A number of preferred examples of this application will be introduced below with reference to the accompanying drawings of the specification, such that the technical content can be clearly and easily understood. This application can be embodied through examples of many different forms, and the protection scope of this application is not limited to the examples mentioned herein.

The general design idea of the present disclosure is as follows:

1. Two RF pulses α and β are used to respectively flip over a longitudinal magnetization into a transverse plane at different moments, so as to obtain observable transverse magnetization.
2. The transverse magnetization obtained by flipping over the longitudinal magnetization by means of α and β are respectively rephased in two different echo trains by means of gradient pulses.
3. Navigator echo signals are respectively collected before the two gradient echo trains, and an amplitude difference between two gradient echo train signals is corrected on the basis of an amplitude difference between the two navigator echo signals.
4. A MUSSELS method is used to reconstruct signals collected by the two gradient echo trains, so as to obtain two sets of image data, and the two sets of image data are averaged to obtain a final image.

A momentum of a phase encoding blip gradient can be set to $2/(\gamma_H{*}FoV_{PE})$ or $4/(\gamma_H{*}FoV_{PE})$. $\gamma_H$ is a gyromagnetic ratio of hydrogen nuclei, and $FoV_{PE}$ is a size of an imaging field of view in the phase encoding direction. This further reduces image distortion, thereby obtaining images with higher resolution.

Phase encoding blip gradients with different polarities are used for the first gradient echo train and the second gradient echo train. Two images are reconstructed from the signals of the first gradient echo train and the second gradient echo train, and magnetic field distribution is estimated based on the two images, thereby correcting image distortion.

Three RF pulses and three gradient echo trains are used to collect signals, thereby obtaining the image through reconstruction.

Specifically, a spin echo module containing a 180° RF pulse is applied, to obtain $T_2$-weighted images with reduced distortion. Diffusion-weighted gradients are applied at both sides of the 180° RF pulse to obtain diffusion-weighted images with reduced distortion. The spin echo module is not applied, to obtain $T_2$*-weighted images with reduced distortion.

Specifically, this embodiment provides an echo planar imaging method capable of reducing image distortion. The method is based on a first RF pulse with a flip angle of α, a second RF pulse with a flip angle of β, a spin echo module, as well as a first gradient echo train and a second gradient echo train for collecting echo-planar signals. The flip angle of the first RF pulse is 47°, and the flip angle of the second RF pulse is 122°. The method specifically includes the following steps:

Step 1: Excite a first-part magnetization into a transverse plane by using an excitation level of the first RF pulse and keep a second-part magnetization in a longitudinal plane.

Step 2: After a delay, excite the second-part magnetization into the transverse plane by using an excitation level of the second RF pulse, where the delay is equal to a time interval between centers of the first gradient echo train and the second gradient echo train.

Step 3: Apply the spin echo module, where the spin echo module containing a 180° RF pulse is applied, to obtain $T_2$-weighted images with reduced distortion; diffusion-weighted gradients are applied at both sides of the 180° RF pulse to obtain diffusion-weighted images with reduced distortion; and the spin echo module is not applied, to obtain $T_2$*-weighted images with reduced distortion.

Step 4: Rephase the first-part magnetization by using gradient pulses, and detect a signal of the transverse first-part magnetization in the first gradient echo train to obtain a first signal.

Step 5: Rephase the second-part magnetization by using gradient pulses, and detect a signal of the transverse second-part magnetization in the second gradient echo train to obtain a second signal.

Optionally, in step 4 and step 5, a momentum of $2/(\gamma_H*FoV_{PE})$ or $4/(\gamma_H*FoV_{PE})$ can be selected for phase encoding gradients, where $\gamma_H$ is a gyromagnetic ratio of hydrogen nuclei, and $FoV_{PE}$ is a size of an imaging field of view in the phase encoding direction. In some embodiments, three RF pulses and three gradient echo trains are used to collect signals. In this case, the momentum of the phase encoding gradients can be $3/(\gamma_H*FoV_{PE})$.

Step 6: Alternately store the first signal and the second signal along a phase encoding direction to reconstruct k-space, thereby obtaining a final image. Specifically, navigator echo signals are respectively collected before the first gradient echo train and the second gradient echo train, and an amplitude difference between signals of the first gradient echo train and the second gradient echo train is corrected by using an amplitude difference between the two navigator echo signals. As used herein, it is understood that a "navigator echo" is a gradient echo without phase encoding. The signals collected by the first gradient echo train and the second gradient echo train are reconstructed using a MUSSELS method, to obtain two sets of image data, and the two sets of image data are averaged to obtain the final image.

Figure 3:
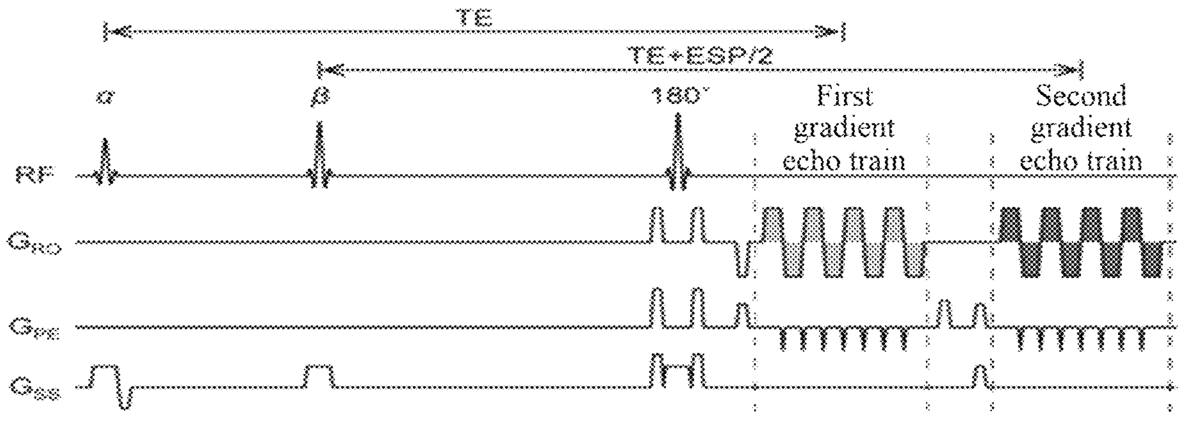
FIG. 3 is a schematic diagram of a pulse sequence according to an embodiment of the present disclosure.
Figure 4:
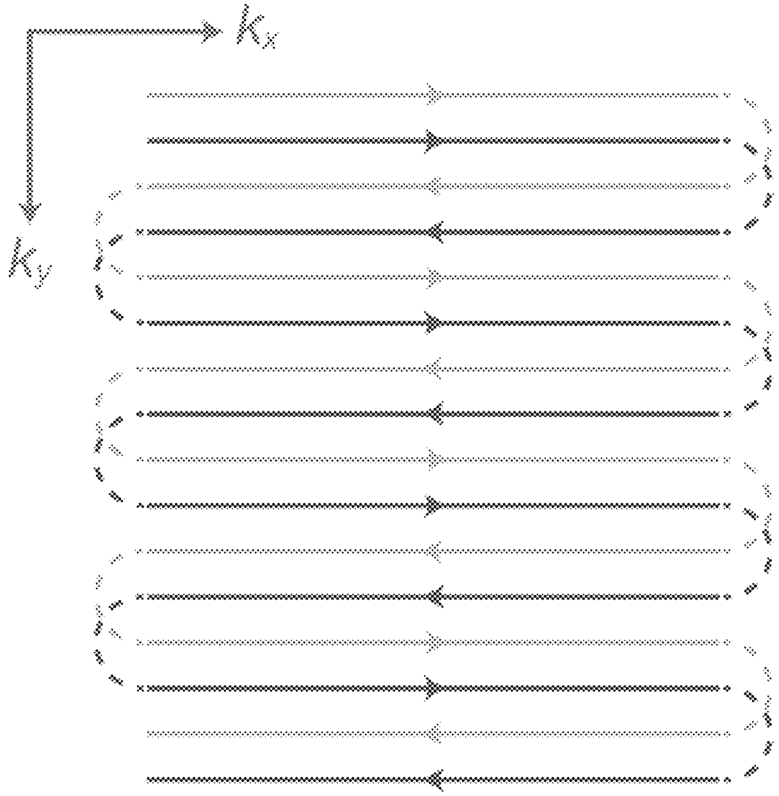
FIG. 4 is a schematic diagram of a k-space filling trajectory according to an embodiment of the present disclosure.

FIG. 3 shows an echo planar imaging sequence based on multi-RF excitation provided in this embodiment. The echo planar imaging sequence includes a first RF pulse with a flip angle of α, a second RF pulse with a flip angle of β, a spin echo module containing a 180° RF pulse, and two gradient echo trains (a first gradient echo train and a second gradient echo train) for collecting echo-planar signals. RF corresponds to RF pulses, $G_{RO}$ corresponds to gradient pulses applied in a readout direction, $G_{PE}$ corresponds to gradient pulses applied in a phase encoding direction, and $G_{ss}$ corresponds to gradient pulses applied in a slice selection direction. FIG. 4 shows a k-space filling trajectory corresponding to the echo planar imaging sequence based on multi-RF excitation provided in this embodiment, where $k_x$ corresponds to k-space of the readout direction, $k_y$ corresponds to k-space of the phase encoding direction, and the signals collected by the two gradient echo trains are alternately combined and filled into k-space in a manner depicted in FIG. 4.

A comparative measurement of a healthy volunteer's head scan was performed on a 3T magnetic resonance imaging system equipped with a 32-channel head receiving coil array using both the conventional single echo planar imaging sequence and the echo planar imaging sequence according to the embodiments of the present disclosure. Two sequences were employed in the test: the echo planar imaging sequence based on the prior art and the echo planar imaging sequence according to this embodiment. In the comparative experiment of the two echo planar imaging sequences, the imaging field of view was 240×240 $mm^2$, the slice thickness was 5 mm, TR was 4000 ms, TE was 92 ms, echo spacing was 0.57 ms, in-plane resolution was 2.5×2.5 $mm^2$, and the number of slices collected was 19. For the echo planar imaging sequence based on the prior art, a RF pulse with a flip angle of 90° was used to excite the signal, then a spin echo module containing a 180° RF pulse was applied, and a single gradient echo train, with a length of 96, was used to collect signals. For the echo planar imaging sequence according to this embodiment, an RF pulse with a flip angle of 47° and an RF pulse with a flip angle of 122° were used to excite the signal, then a spin echo module containing a 180° RF pulse was applied, and two gradient echo trains, each with a length of 48, were used to collect signals. The amplitude of the phase encoding gradient was twice that of the echo planar sequence in the prior art. For the echo planar imaging sequence according to this embodiment, the MUSSELS method was used to reconstruct the signals collected by the two gradient echo trains, resulting in two sets of image data. The two sets of image data were averaged to obtain the final image.

Figure 5:
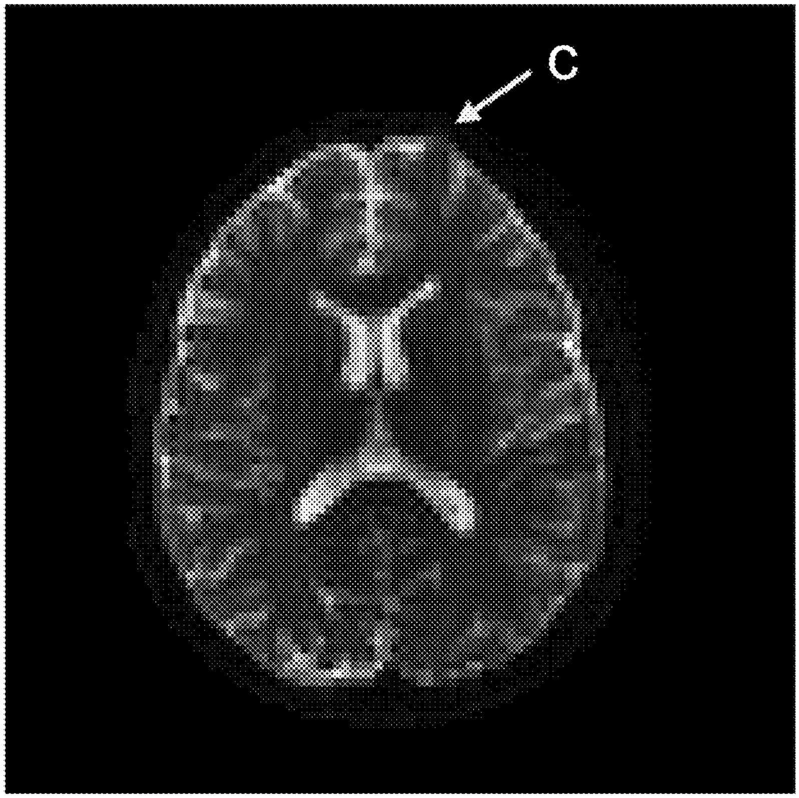
FIG. 5 shows a slice-9 brain image according to an embodiment of the present disclosure.
Figure 6:
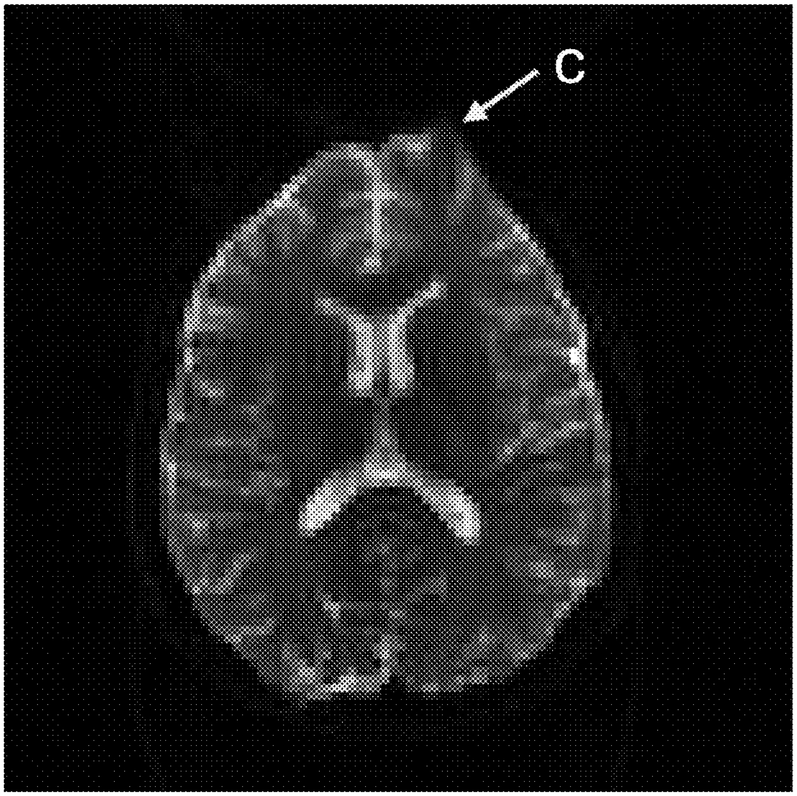
FIG. 6 shows a slice-9 brain image using the prior art.
Figure 7:
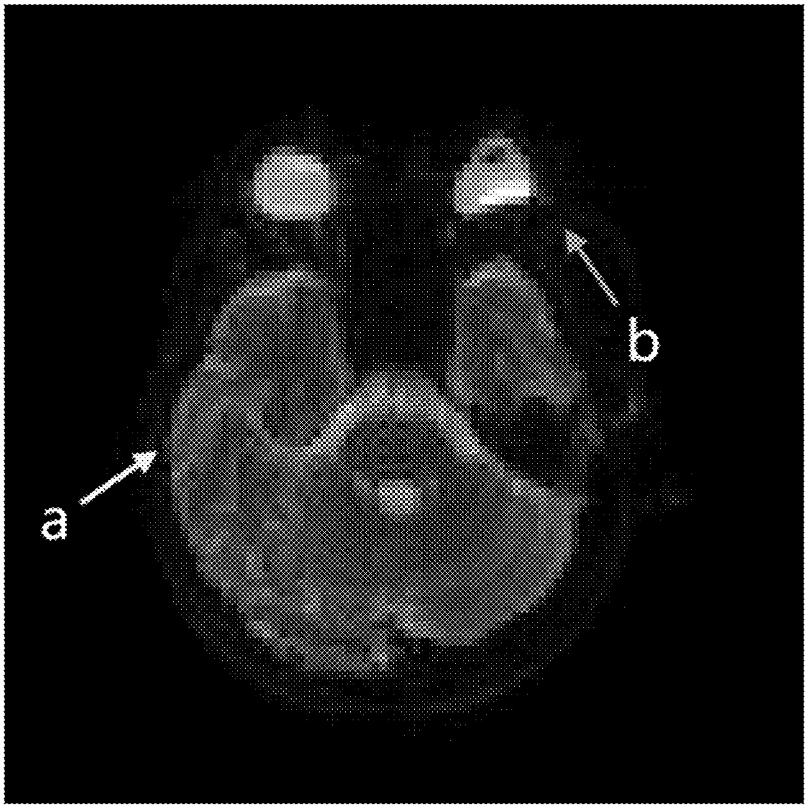
FIG. 7 shows a slice-15 brain image according to an embodiment of the present disclosure.
Figure 8:
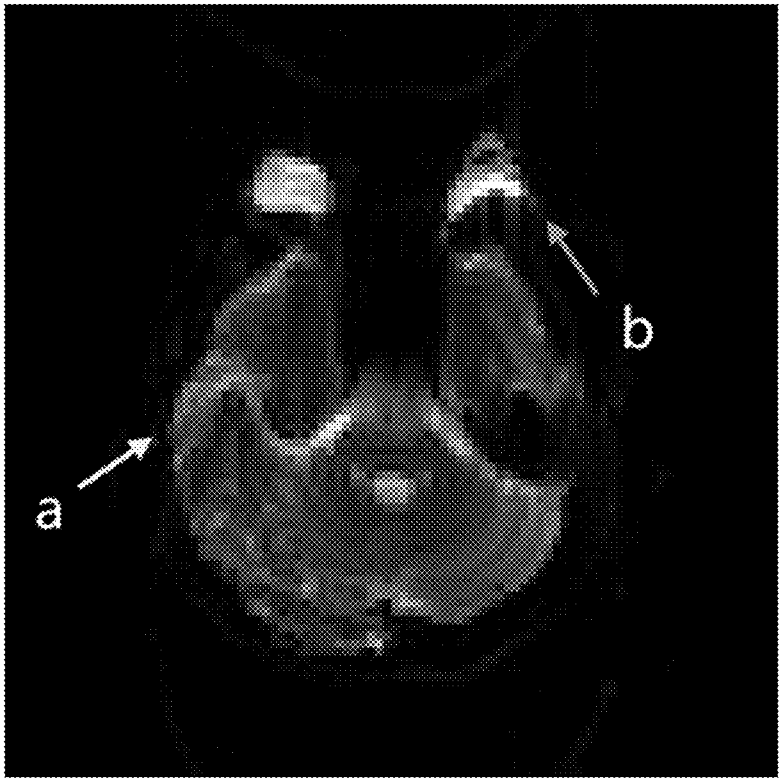
FIG. 8 shows a slice-15 brain image using the prior art.

FIG. 5 to FIG. 8 display the results of the volunteer experiments using the two sequences described above. FIG. 5 shows a slice-9 image using the echo planar imaging sequence according to the present embodiment; FIG. 7 shows a slice-15 image using the echo planar imaging sequence according to the present embodiment; FIG. 6 shows a slice-9 image using the echo planar imaging sequence based on the prior art; and FIG. 8 shows a slice-15 image using the echo planar imaging sequence based on the prior art. Compared with FIG. 6, FIG. 5 exhibits reduced geometric distortion in the frontal area (indicated by arrow c). In comparison with FIG. 8, FIG. 7 notably shows reduced geometric distortion in the eye area (indicated by arrow b) and significantly improved signal pile-up (indicated by arrow a).

Preferred specific examples of this application are described in detail above. It should be understood that, a person of ordinary skill in the art can make various modifications and variations according to the concept of this application without creative efforts. Therefore, all technical solutions that can be obtained by a person skilled in the art based on the prior art through logical analysis, deduction, or limited experiments according to the concept of this application should fall within the protection scope defined by the claims.

What is claimed is:

1. An echo planar imaging method capable of reducing image distortion, based on a first radio frequency (RF) pulse with a flip angle of α, a second RF pulse with a flip angle of β, a spin echo module, as well as a first gradient echo train and a second gradient echo train that are used for collecting echo-planar signals, and specifically comprising the following steps:

step 1: exciting a first-part magnetization into a transverse plane by using an excitation level of the first RF pulse and keeping a second-part magnetization in a longitudinal plane;

step 2: after a delay, exciting the second-part magnetization into the transverse plane by using an excitation level of the second RF pulse;

step 3: applying the spin echo module;

step 4: rephasing the first-part magnetization by using gradient pulses, and detecting a signal of the transverse first-part magnetization in the first gradient echo train to obtain a first signal;

step 5: rephasing the second-part magnetization by using gradient pulses, and detecting a signal of the transverse second-part magnetization in the second gradient echo train to obtain a second signal; and step 6: alternately storing the first signal and the second signal along a phase encoding direction to reconstruct k-space, reconstructing sets of image data, and averaging the sets of image data, thereby obtaining a final image, wherein the sets of image data comprise a set of image data reconstructed from a signal of the first gradient echo train and a set of image data reconstructed from a signal of the second gradient echo train.

2. The echo planar imaging method capable of reducing image distortion according to claim 1, wherein the flip angle of the first RF pulse is 47°, and the flip angle of the second RF pulse is 122°.

3. The echo planar imaging method capable of reducing image distortion according to claim 1, wherein in step 2, the delay is equal to a time interval between centers of the first gradient echo train and the second gradient echo train.

4. The echo planar imaging method capable of reducing image distortion according to claim 1, wherein in step 3, the spin echo module containing a 180° RF pulse is applied to obtain $T_2$-weighted images with reduced distortion.

5. The echo planar imaging method capable of reducing image distortion according to claim 4, wherein in step 3, diffusion-weighted gradients are applied at both sides of the 180° RF pulse to obtain diffusion-weighted images with reduced distortion.

6. The echo planar imaging method capable of reducing image distortion according to claim 1, wherein in step 6, first and second navigator echo signals are respectively collected before the first gradient echo train and the second gradient echo train, and an amplitude difference between signals of the first gradient echo train and the second gradient echo train is corrected by using an amplitude difference between the first and second navigator echo signals.

7. The echo planar imaging method capable of reducing image distortion according to claim 1, wherein the sets of image data are reconstructed using a MUSSELS method.

8. The echo planar imaging method capable of reducing image distortion according to claim 1, wherein in step 4 and step 5, phase encoding gradients with different polarities are used for the first gradient echo train and the second gradient echo train; two images are reconstructed from the signals of the first gradient echo train and the second gradient echo train, and magnetic field distribution is estimated based on the two images, thereby correcting image distortion.

9. The echo planar imaging method capable of reducing image distortion according to claim 1, a third RF pulse and a third gradient echo train are further applied; signals are collected by using the first gradient echo train, the second gradient echo train, and the third gradient echo train; in step 4 and step 5, a momentum of $3/(\gamma_H{*}FoV_{PE})$ is selected for phase encoding gradients, wherein $\gamma_H$ is a gyromagnetic ratio of hydrogen nuclei, and $FoV_{PE}$ is a size of an imaging field of view in the phase encoding direction.

10. An echo planar imaging method capable of reducing image distortion, based on a first radio frequency (RF) pulse with a flip angle of α, a second RF pulse with a flip angle of β, as well as a first gradient echo train and a second gradient echo train that are used for collecting echo-planar signals, and specifically comprising the following steps:

step 1: exciting a first-part magnetization into a transverse plane by using an excitation level of the first RF pulse and keeping a second-part magnetization in a longitudinal plane;

step 2: after a delay, exciting the second-part magnetization into the transverse plane by using an excitation level of the second RF pulse;

step 3: rephasing the first-part magnetization by using gradient pulses, and detecting a signal of the transverse first-part magnetization in the first gradient echo train to obtain a first signal;

step 4: rephasing the second-part magnetization by using gradient pulses, and detecting a signal of the transverse second-part magnetization in the second gradient echo train to obtain a second signal; and step 5: alternately storing the first signal and the second signal along a phase encoding direction to reconstruct k-space, reconstructing sets of image data, and averaging the sets of image data, thereby obtaining a final image, wherein the sets of image data comprise a set of image data reconstructed from a signal of the first gradient echo train and a set of image data reconstructed from a signal of the second gradient echo train.

* * * * *